(12) United States Patent
Gong et al.

(10) Patent No.: US 7,830,085 B2
(45) Date of Patent: Nov. 9, 2010

(54) WHITE ELECTROPHOSPHORESCENCE FROM SEMICONDUCTING POLYMER BLENDS

(75) Inventors: Xiong Gong, Goleta, CA (US); Wanli Ma, Goleta, CA (US); Jacek Ostrowski, Santa Barbara, CA (US); Guillermo C. Bazan, Santa Barbara, CA (US); Daniel Moses, Santa Barbara, CA (US); Alan J. Heeger, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/680,084

(22) Filed: Oct. 6, 2003

(65) Prior Publication Data

US 2005/0073245 A1    Apr. 7, 2005

(51) Int. Cl.
*H01L 51/54*    (2006.01)
*H01L 51/56*    (2006.01)

(52) U.S. Cl. .................. 313/506; 313/504; 428/690; 428/917; 428/212

(58) Field of Classification Search ............... 428/690, 428/917; 252/301.4 R; 313/502, 506, 504
See application file for complete search history.

(56) References Cited

U.S. PATENT DOCUMENTS

| | | | |
|---|---|---|---|
| 6,790,538 B2 | 9/2004 | Naito | |
| 6,830,828 B2* | 12/2004 | Thompson et al. | 428/690 |
| 6,869,695 B2* | 3/2005 | Thompson et al. | 428/690 |
| 6,999,222 B2* | 2/2006 | Bazan et al. | 359/248 |
| 7,009,338 B2* | 3/2006 | D'Andrade et al. | 313/504 |
| 2002/0125819 A1* | 9/2002 | Mishima | 313/504 |
| 2003/0205696 A1* | 11/2003 | Thoms et al. | 252/301.16 |
| 2004/0033388 A1 | 2/2004 | Kim et al. | |
| 2004/0110031 A1* | 6/2004 | Fukuda et al. | 428/690 |

FOREIGN PATENT DOCUMENTS

| | | |
|---|---|---|
| GB | 2340304 | 2/2000 |
| JP | 2002-280183 A | 9/2002 |
| JP | 2003-77673 A | 3/2003 |
| JP | 2003-086376 A | 3/2003 |
| JP | 2003-208982 A | 7/2003 |
| JP | 2004-253175 A | 9/2004 |
| JP | 2004-79535 A | 11/2004 |
| WO | WO 03/059015 | 7/2003 |

OTHER PUBLICATIONS

Braun et al. "Visible light emission from semiconducting polymer diodes" *Appl. Phys. Letters* (1991) 58:1982-1984.
Chao et al. "White light emission from exciplex in a bilayer device with two blue light-emitting polymers" *Appl. Phys. Letters* (1998) 73:426-428.

(Continued)

*Primary Examiner*—D. Lawrence Tarazano
*Assistant Examiner*—Camie S Thompson
(74) *Attorney, Agent, or Firm*—Morrison & Foerster LLP

(57) ABSTRACT

White light-emitting electrophosphorescent polymeric light-emitting diodes (PLEDs) are demonstrated using semiconducting polymers blended with organometallic emitters as emissive materials in a common region. These materials may be cast from solution. The CIE coordinates, the color temperatures and the color rendering indices of the white emission are insensitive to the brightness, applied voltage and applied current density.

32 Claims, 6 Drawing Sheets

Device configuration

OTHER PUBLICATIONS

Chen et al. "Triplet excition confinement in phosphorescent polymer light-emitting diodes" *Applied Physics Letters* (2003) 82(7):1006-1008.

deJong et al. "Stability of the interface between indium-tin-oxide and poly(3,4-ethylenedioxythiophene)/poly(styrenesulfonate) in polymer light-emitting diodes" *Appl. Phys. Letters* (2000) 77:2255-2257.

Friend et al. "Electroluminescence in conjugated polymers" *Nature* (1999) 397:121-128.

Gong et al. "Red electrophosphorescence from polymer doped with iridium complex" *Appl. Phys. Letters* (2002) 81:3711-3713.

Gong et al. "Stabilized Blue Emission from Plyfluorene-Based Light-Emitting Diodes: Elimination of Fluorenone Defects" *Adv. Func. Mater.* (2003) 13:325-330.

Gong et al. "High-performance polymer light-emitting diodes fabricated with a polymer hole injection layer" *Appl. Phys. Letters* (2003) 83:183-185.

Gong et al. "Electrophosphorescence from a Conjugated Copolymer Doped with an Iridium Complex: High Brightness and Improved Operational Stability" *Adv. Mat.* (2003) 15:45-49.

Greczynski et al. "Characterization of the PEDOT-PSS system by means of X-ray and ultraviolet photoelectron spectroscopy" *Thin Solid Films* (1999) 354:129-135.

Hamada et al. "White-Light-Emitting Material for Organic Electroluminescent Devices" *Jpn. J. Appl. Physics* (1996) 35:1339-1341.

Heeger et al. "Light Emission from Semiconducting Polymers: Light-Emitting Diodes, Light-Emitting Electrochemical Cells, Lasers and White Light for the Future" *Solid State Commu.* (1998) 107:673-679.

Heeger et al. "Nobel Lecture: Semiconducting and metallic polymers: The fourth generation of polymeric materials" *Rev. Modern Phys.* (2001) 73:681-700.

Hide et al. "White light from InGaN/conjugated polymer hybrid light-emitting diodes" *Appl. Phys. Letters* (1997) 70:2664-2666.

Je-Jung et al. "Opto-Electric Properties in the Phosphor Doped Polymeric Light-Emitting Diodes" *Proceedings of the SPIE—The International Society for Optical Engineering SPIE-Int. Soc. Opt. Eng USA* (2002) 4641:60-67.

Kawamura et al. "Energy transfer in polymer electrophosphorescent light emitting devices with single and multiple doped luminescent layers" *J. of Applied Physics* (2002) 92(1):87-93.

Kido et al. "White light-emitting organic electroluminescent devices using the poly(N-vinylcarbazole) emitter layer doped with three fluorescent dyes" *Appl. Phys. Letters* (1994) 64:815-817.

Kido et al. "Single-layer white light-emitting organic electroluminescent devices based on dye-dispersed poly(N-vinylcarbozole)" *Appl. Phys. Letters* (1995) 67:2281-2283.

Müller et al. "Mutli-colour organic light-emitting displays by solution processing" *Nature* (200) 421:829-833.

Ostrowski et al. "Amorphous iridium complexes for electrophosphorescent light emitting devices" *Chem. Commun.* (2002) 7:784-785.

Park et al. "Preparation and chemiluminescent properties of perylene-containing polyimides as polymeric red fluorophores" *Synthe. Met.* (2003) 177-184.

Strukelj et al. "Organic Multilayer White Light Emitting Diodes" *American Chem. Society* (1996) 118:1213-1214.

Tanaka et al. "White Light Emission from Polymer Electrophosphorescent Light-Emitting Devices Doped with Iridium Complexes" *Jpn. J. Appl. Physics* (2003) 42:2737-2740.

Tokito et al. "High-efficiency phosphorescent polymer light-emitting devices" *Organic Electronics, Elsevier*, Amsterdam (2003) 4(2/3):105-111.

Wang et al. "Multicolor multilayer light-emitting devices based on pyridine-containing conjugated polymers and para-sexiphenyl oligomer" *Appl. Phys. Letters* (1999) 74:3613-3615.

Zhang et al. "Use of Kubo formalism to study transport beyond the Born approximation: Application to low-temperature transport in Si metal-oxide-semiconductor field-effect transistors" *Appl. Phys. Letters* (1998) 73:1577-1579.

International Search Report, PCT/US2004/032756 dated Apr. 1, 2005.

Chen, F-C. et al. (Feb. 17, 2003). "Triplet-exciton Confinement in Phosphorescent Polymer Light-emitting Diodes," *Applied Physics Letters* 82(7):1006-1008.

Gong, X. et al. (Nov. 11, 2002). "Red Electrophosphorescence From Polymer Doped with Iridium Complex," *Applied Physics Letters* 81(20):3711-3713.

Yun, Je-J. et al. (2002). "Opto-electric Properties in the Phosphor Doped Polymeric Light-emitting Diodes," *Proceedings of SPIE* 4641:60-67.

\* cited by examiner

Molecular structures

PFO

Ir(HFP)$_3$ m=99 and n=1

PFO-F (1%)

Device configuration

WHITE ELECTROPHOSPHORESCENCE FROM SEMICONDUCTING POLYMER BLENDS

BACKGROUND OF THE INVENTION

1. Field of the Invention

The present invention relates to polymeric electrophosphorescent light-emitting diodes (PLEDs). More specifically, the present invention relates to white electrophosphorescence from semiconducting organic polymer blends comprising two or three or more commonly-hosted emitters. White emission is achieved from the polymer blends in a single emissive region. The strategy developed in this invention allows the fabrication of white electrophosphorescent PLEDs by spin-casting the emissive polymer materials from solution. The white light-emitting polymer materials of this invention also allow the relatively simple fabrication of electrophosphorescent PLEDs which emit illumination quality white light with high brightness, high efficiency, suitable color temperature, high color rendering index, and stable CIE (Commission Internationale d'Eclairage) coordinates. The white electrophosphorescence emission of the present invention can be used for solid state lighting.

2. Background of the Invention

Polymeric light-emitting diodes (PLEDs) that emit white light are of interest because they offer promise for use in high efficiency active matrix displays (with color filters) and because they might eventually be used for solid state lighting [A. J. Heeger, Solid State Commu., 1998. 107, 673 & Rev. Modern Phys., 2001, 73, 681; R. H. Friend, R. W. Gymer, A. B. Holmes, J. H. Burroughes, R. N. Marks, C. Taliani, D. D. C. Bradley, D. A. Dos Santos, J. L. Brédas, M. Lögdlund, and W. R. Salaneck, Nature, 1999, 397, 121]. White light electrophosphorescent PLEDs fabricated with semiconducting polymers doped with organometallic emitters offer the additional promise of "plastic" electronics. White light electrophosphorescent PLEDs can be fabricated by casting polymer blends from solution, thereby enabling relatively simple and low cost manufacturing processes [G. D. Müller, A. Falcou, N. Reckefuss, M. Roijhn, V. Wiederhirn, P. Rudati, H. Frohne, O. Nuyken, H. Becker, K. Meerholz, Nature, 2003, 421, 829].

Several approaches have been used to generate white light from organic light-emitting diodes (OLEDs) and from PLEDs. Multilayer OLEDs structures have been fabricated by high vacuum deposition of small molecules [M. Strukelj, R. H. Jordan, A. Dodabalapur, J Am. Chem. Soc. 1996, 118, 1213; Z. Shen, P. E. Burrows, V. Bulvić, S. R. Forrest, and M. E. Thompson, Science, 1997, 276, 2009] In these devices, different layers emit different colors of visible light which combine to give white light. White light has also been demonstrated from OLEDs and PLEDs by utilizing excimer or exciplex emission [Y. Hamada, T. Sano, H. Fujii, Y. Nishio, Jpn. J. Appl. Phys., 1996, 35, 1339; C. L. Chao, S. A. Chen, Appl. Phys. Lett., 1998, 73, 426; Y. Z. Wang, R. G. Sun, F. Meghdadi, G. Leising, A. J. Epstein, Appl. Phys. Lett., 1999, 74, 3613]. Single layer polymer-based structures or hybrid inorganic/conjugated polymer structures are advantageous because they can be fabricated by solution processing at room temperature [J. Kido, H. Shionoya, K. Nagai, Appl. Phys. Lett. 1995, 67, 2281; J. Kido, H. Hongawa, K. Okuyama and K. Nagai, Appl. Phys. Lett. 1994, 64, 815; F. Hide, P. Kozodoy, S. P. DenBaars, A. J. Heeger, Appl. Phys. Lett., 1997, 70, 2664; C. Zhang A. J. Heeger, J. Appl. Phys. 1998, 84, 1579]. White light PLEDs fabricated by casting the luminescent materials from solution would result in a simpler and therefore less expensive manufacturing process.

White light is characterized by three quantities: the CIE (Commission Internationale d'Eclairage) coordinates, the color temperature (CT) and the color rendering index (CRI). "Pure" white light has CIE coordinates of (0.333, 0.333), and is obtained by balancing the emission of the colors employed. For illumination applications, the CT needs to be equivalent to that of a blackbody source, that is, between 3000K and 7500K. Average daylight has CT=6500K, and a fluorescent lamp (warm white) has CT=3000K [R. W. G. Hunt, Measuring Color, $2^{th}$ Ed. Ellis Horwood, 1991]. The CRI is a numerical measure of how "true" colors look when viewed with the light source. CRI values range from 0 to 100, with 100 representing true color reproduction. Fluorescent lamps have CRI ratings between 60 and 99. Though a CRI value of at least 70 may be acceptable for certain applications, a preferred white light source will have a CRI for about 80 or higher. The demonstration of PLEDs which emit illumination quality white light with high brightness, high efficiency, suitable CT, high CRI and stable CIE coordinates is of importance to the future of solid state lighting.

SUMMARY OF THE INVENTION

The present invention is directed to efficient polymeric electrophosphorescent light-emitting devices (PLEDs). More specifically, the present invention is directed to efficient white electrophosphorescent PLEDs. The devices of the present invention employ at least two, and most typically two or three, luminescent emitters, in a single emissive region (rather than red, green and blue emission in different regions that appear white when averaged by the observer). In this description, devices having two emitters are referred to as "Type I" devices and those having three or more emitters are referred to as "Type II" devices. The luminescent emitters emit white light via a combination of fluorescence (from singlet states) and phosphorescence (from triplet states). White light is achieved from two or three or more luminescent emitters in a single emissive region through the combined emission from at least one emissive semiconducting organic polymer and at least one organometallic emitters admixed into the organic polymer phase. This single emissive layer comprised of two or more emissive centers allows the fabrication of white electrophosphorescent PLEDs by solution processing. This strategy also allows the relatively simple fabrication of bright and efficient white electrophosphorescent PLEDs that exhibit a high color rendering index, suitable color temperature and CIE coordinates. Moreover, because the semiconducting polymer phase provides a common host for the multiple emissive centers the color rendering index, color temperature and CIE coordinates from these white electrophosphorescent PLEDs are insensitive to brightness, applied voltages and applied current density.

The object of the present invention is to provide a method to produce white electrophosphorescent PLEDs that exhibit high luminous efficiency, external quantum efficiency and brightness for applications on solid state lighting and as the backlight for liquid crystal displays (LCDs).

Another object of the present invention is to produce white electrophosphorescent PLEDs that exhibit white light with high color rendering index, suitable color temperature, suitable CIE coordinates.

A third object of the present invention is to produce white electrophosphorescent PLEDs with stable color rendering index, stable color temperature and stable CIE coordinate all of which are insensitive to brightness, applied voltages and applied current density.

Yet another object of the present invention is to produce white light electrophosphorescent PLEDs that produce white emission having CIE x, y-chromaticity coordinates close to the CIE coordinates of pure white light (0.333, 0.333).

Yet another object of the present invention is to produce white light electrophosphorescent PLEDs that produce white emission having color temperature close to or equal to 6500K of average daylight and 4700K of sunlight at solar altitude 20°.

DESCRIPTION OF THE PREFERRED EMBODIMENTS

The invention is based on the discovery that incorporating fluorescence from one or more semiconducting organic polymers or copolymers such as conjugated polymers and conjugated co-polymers and phosphorescence from one or more organometallic emitters dispersed in the one or more polymers provides a white light with stable CIE coordinates, high color temperature and high color rendering index. Such blends emit white light for applications in solid state lighting and for use as backlights for LCDs.

Device Configuration

Figure 9:
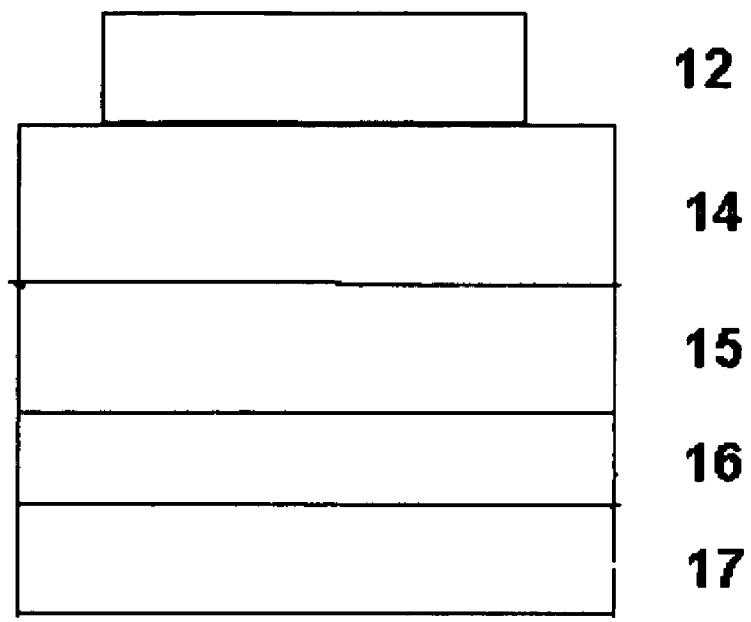
FIG. 9 shows a schematic cross section of a representative device of this invention.

As shown in FIG. 9, the electrophosphorescent PLEDs comprise an electron injecting (cathode) contact 12, for example a relatively low work function metal (Ca, Ba or the like) as one electrode in contact with one side of a semiconducting and luminescent polymer film 14. Film 14 is made up of one or more fluorescent organic polymers admixed with one or more organometallic phosphorescent emitters as a single layer. The other side of film 14 is in contact with a hole-injecting second electrode. While this could be a simple transparent layer of a high work function material, in a preferred embodiment this hole-injecting electrode includes a hole-injecting layer 15 which has been coated onto a layer 16 of transparent conducting material with high work function (high ionization potential) to serve as the second (anode) electrode; i.e. a configuration that is well known. [D. Braun and A. J. Heeger, Appl. Phys. Lett., 1991, 58, 1982]. A representative thin hole-injecting layer 15 is composed of a polymer such as poly(3,4-ethylene dioxythiophene):poly(styrene sulfonic acid) (PEDOT:PSS) or poly(bis(tetraphenyldiamino)biphenyl-perfluorocyclobutane) (poly(BTPD-Si-PFCB)) [X. Gong, D. Moses, A. J. Heeger, S. Liu and A. K.-Y. Jen, Appl. Phys. Lett., 2003, 83, 183] which can be deposited for example on indium tin oxide (ITO) layer 16, to give a hole-injecting bi-layer electrode (anode). Layer 17, is a transparent support or substrate through which the light is emitted. If desired, this configuration could be reversed with the low work function electrode on the support. In this case emission would likely be through the high work function anode.

The High Work Function Electrode (16)

The high work function hole-injecting electrode is typically a transparent conductive metal-metal oxide or sulfide material such as indium-tin oxide (ITO) with resistivity of 20 ohm/square or less and transmission of 89% or greater @ 550 nm. Other materials are available such as thin, transparent layers of gold or silver. A "high work function" in this context is generally considered to be a work function of about 4.5 eV or greater. This electrode is commonly deposited on the solid support by thermal vapor deposition, electron beam evaporation, RF or Magnetron sputtering, chemical deposition or the like. These same processes can be used to deposit the low work-function electrode as well. The principal requirement of the high work function electrode is the combination of a suitable work function, low resistivity and high transparency.

The Low Work Function Electrode (12)

The low work function electrode 12 serves as an electron-injecting contact. It is typically made of a low work function metal or alloy placed on the surface of the active emissive polymeric layer 14 opposite from electrode 16. Low work function metals in the context of the present invention include materials with a work function of about 4.3 eV or less and are well known in the art to include, for example Ba, Ca, Mg, In and Tb. They are often accompanied by a layer of stable metal such as Ag, Au, Al or the like. This serves as a protection layer on top of reactive materials such as Ba, Ca, and Tb. Other low work function (low ionization potential) conducting materials can be used in place of a conventional metal as the electron-injecting contact. The thickness of the electron-injecting electrode film is not critical and can be adjusted to achieve the desired surface resistance (surface resistance or sheet resistance is defined as the resistivity divided by the thickness) and can vary in the range of from significantly less than 100 Å to 2000 Å. These materials are generally laid down as thin films with the techniques set out in the description of electrode 16.

The Hole-injection Layer (15)

A hole-injection layer 15 is often present between the emissive layer 14 and hole-injecting electrode 16. Layer 15 is typically a 20 to 30 nm thick layer of conductive polymer. The polymer is cast as a solution which is evaporated to yield the desired layer 15. Examples of suitable polymers include PEDOT:PSS cast from aqueous solution or the precursor of poly(BTPD-Si-PFCB) [S. Liu, X. Z. Jiang, H. Ma, M. S. Liu, A. K.-Y. jen, Macro., 2000, 33, 3514; X. Gong, D. Moses, A. J. Heeger, S. Liu and A. K.-Y. Jen, Appl. Phys. Lett., 2003, 83, 183]. PEDOT:PSS is preferred. On other hand, by using by poly(BTPD-Si-PFCB) as a hole-injection layer, many processing issues brought about by the use of PEDOT:PSS, such as the undesirable etching of emissive polymers, the undesirable etching of ITO, and the formation of micro-shorts can be avoided [G. Greczynski, Th. Kugler and W. R. Salaneck, Thin Solid Films, 1999, 354, 129; M. P. de Jong, L. J. van Ijzendoorn, M. J. A. de Voigt, Appl. Phys. Lett. 2000, 77, 2255].

The Emissive Layer (14)

Figure 8:
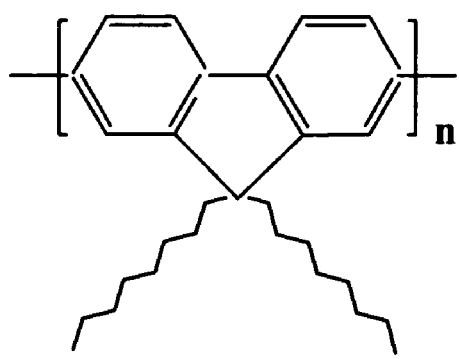
FIG. 8 shows the molecular structures of the representative conductive polymers poly(9,9-dioctylfluorene) (PFO), poly (9,9-dioctylfluorene-co-fluorenone) with 1% fluorenone (PFO-F(1%)) and a representative organometallic emitter tris (2,5-bis-2'-(9',9'-dihexylfluorene) pyridine) iridium (III), (Ir (HFP)$_3$).
Figure 8:
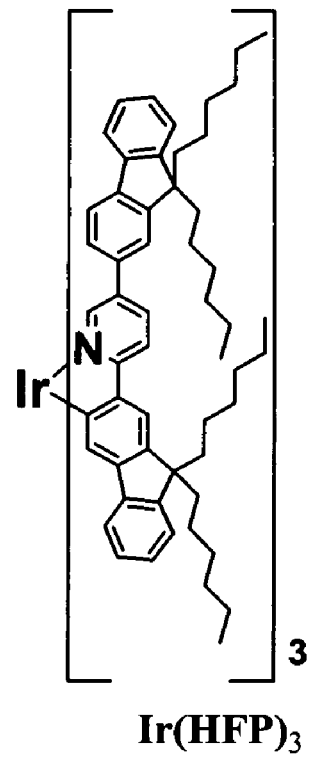
Figure 8:
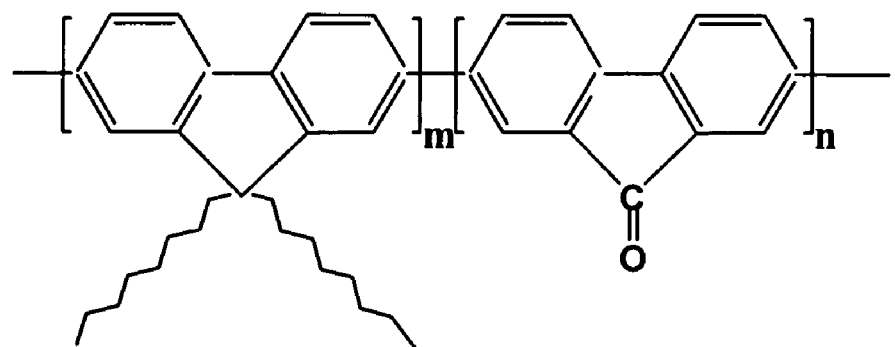

The emissive layer 14 shown in FIG. 9 contains a blend (mixture) of one or more emissive semiconducting polymers with one or more organometallic emitters. Usually the polymer is conjugated. Preferred examples include the emissive layers used in Type I (two emitter) devices made from the polymer poly(9,9-dioctylfluorene) ("PFO") with the organometallic emitter tris (2,5-bis-2'-(9',9'-dihexylfluorene) pyridine) iridium (III), ("Ir(HFP)$_3$"). Type II (three emitter) devices can be made, for example, from blends of polymer PFO with polymer poly(9,9-dioctylfluorene-co-fluorenone) with 1% fluorenone (PFO-F(1%)) and organometallic emitter Ir(HFP)$_3$. FIG. 8 shows the molecular structures of PFO, PFO-F(1%) and Ir(HFP)$_3$. PFO is commercially available. The synthesis of Ir(HFP)$_3$ was reported in the scientific literature [J. C. Ostrowski, M. R. Robinson, A. J. Heeger and G. C. Bazan, Chem. Commun., 2002, 7, 784]. The synthesis of PFO-F(1%) was also reported [X. Gong, D. Moses and A. J. Heeger, Synth. Met. 2003].

Representative organometallic emitters are complexes and compounds having Ir, Pr, Os, Ru or Au or the like as a center atom.

Support (17)

The various active layers 14-16 are usually supported by a solid substrate 17. This can be a rigid material such as plastic, glass, silicon, ceramic or the like or a flexible material such as a flexible plastic as well. This support may be transparent (as is the support shown in FIG. 9) in which case the light can be emitted through it and through the transparent electrode 16. Alternatively, the support can be non-transparent, in which case the transparent electrode 16, through which light is emitted, is on the surface of the emissive layer away from the support.

Fabrication Methods

The white PLEDs may be fabricated using techniques well known in the art, such as solution casting, screen printing, contact printing, precursor polymer processing, melt-processing, and the like to lay down the emissive polymer blend layer 14 and the hole-injection layer 15. Sputtering, evaporation and the like are used to lay down the electrode materials.

The present invention provides a method for obtaining efficient white electrophosphorescent PLEDs by solution processing. The solution contains the conjugated polymers and the organometallic emitters that make up the emissive layer. In a preferred embodiment, the solution of conjugated polymers blended with organometallic emitters is formed in a suitable solvent such as an organic solvent, especially a relatively nonpolar hydrocarbon or the like. A thin semitransparent film is then cast onto an electrode on a substrate such as an optional bilayer electrode (for example the hole-injection layer deposited onto ITO on glass) or a semitransparent metal on a support. The PLED is built up with successive layers as described above.

By processing the emissive layer from solvents, the emitted light can be tuned by varying the concentrations. Thus, by processing from solution, efficient white light with stable CIE coordinates, high CRI values and stable color temperature can be achieved from electrophosphorescent PLEDs. Thus, the invention discloses a preferred method for obtaining white electrophosphorescent PLEDs from solution processing. Moreover, the invention discloses a method for obtaining white electrophosphorescent PLEDs, which have high brightness, stable CIE coordinates close to CIE coordinates (0.333, 0.333) of pure white light, high CRI values and stable color temperature. And more important, this invention discloses a method for obtaining white electrophosphorescent PLEDs whose CIE coordinates, CRI values and color temperature are insensitive to brightness, applied voltages and applied current density.

Mechanism

The mechanism for achieving white light from the organometallic emitter—organic polymer emitter (Type I) electrophosphorescent PLEDs, such as the Ir(HFP)$_3$:PFO blends, involves hole trapping on the Ir(HFP)$_3$ followed by electron trapping on the Ir(HFP)$_3^+$ cation [X. Gong, J. C. Ostrowski, D. Moses, G. C. Bazan, and A. J. Heeger, Appl. Phys. Lett. 2002, 81, 3711]. In the white electrophosphorescent PLEDs, the injected holes (from ITO/PEDOT:PSS or poly(BTPD-Si-PFCB) and electrons (from the electron-injecting electrode) can either recombine on the PFO main chain to produce blue and green emission, [X. Gong, P. Iyer, D. Moses, G. C. Bazan, A. J. Heeger, Adv. Func. Mater., 2003, 13, 325] or can be trapped by Ir(HFP)$_3$ with subsequent emission of red light from the triplet of Ir(HFP)$_3$. This provides the desired white light [X. Gong, J. C. Ostrowski, D. Moses, G. C. Bazan, A. J. Heeger, M. S. Liu, A. K-Y. Jen, Adv. Mat. 2003, 15, 45; X. Gong, J. C. Ostrowski, D. Moses, G. C. Bazan, A. J. Heeger, J. Poly. Sci. Poly. Phys. 2003; X. Gong, J. C. Ostrowski, D. Moses, G. C. Bazan, and A. J. Heeger, Appl. Phys. Lett. 2002, 81, 3711].

In the Type II electrophosphorescent PLEDs made from the three emitter blends such as Ir(HFP)$_3$:PFO-F(1%):PFO, injected holes and electrons recombine by two processes; direct recombination on the main chain (PFO) to produce blue and green emission in parallel with electron and hole trapping on the fluorenone units and on the Ir(HFP)$_3$ followed by radiative recombination, with green light from PFO-F(1%) and red light from the triplet excited state of Ir(HFP)$_3$ [X. Gong, J. C. Ostrowski, D. Moses, G. C. Bazan, A. J. Heeger, M. S. Liu, A. K-Y. Jen, Adv. Mat. 2003, 15, 45; X. Gong, J. C. Ostrowski, M. R. Robinson, D. Moses, G. C. Bazan, and A. J. Heeger, Adv. Mat. 2002, 14, 581; X. Gong, J. C. Ostrowski, D. Moses, G. C. Bazan, and A. J. Heeger, Appl. Phys. Lett. 2002, 81, 3711].

The following general methods and specific examples are presented merely to illustrate the invention and are not to be construed as limitations thereon.

EXAMPLES

Example 1

Three stock solutions, one containing conjugated polymer PFO, one containing conjugated polymer PFO-F (1%) and one containing organometallic emitter Ir(HFP)$_3$ (see FIG. 8 for structures of these materials) were prepared by dissolving 50 mg PFO, 20 mg PFO-F (1%) and 5 mg Ir(HFP)$_3$ into 1 ml toluene, respectively. Diluting the 0.5 wt.-% Ir(HFP)$_3$ solution gave 0.05 wt.-% Ir(HFP)$_3$ solution. The mixtures were stirred overnight at 65° C. and then cooled to room temperature.

This example demonstrates that these three typical emissive materials used in the practice of this invention are soluble in common organic solvents.

Example 2

Preparation of Type I solution: 2.4 μl of a solution of 0.05 wt.-% Ir(HFP)$_3$ in toluene and 400 μl of a solution of 5 wt.-% PFO in toluene were added into 197.6 μl of pure toluene.

Preparation of Type II solution: 19.2 μl of a solution of 0.05 wt.-% Ir(HFP)$_3$ in toluene and 400 μl of a solution of 5 wt.-% PFO in toluene were added into 180.8 μl of pure toluene. When producing Type II devices, varying amounts of the PFO-F solution prepared in Example 1 were added prior to use as described in these Examples.

This example demonstrates that a mixed solution of the emissive materials can be made at desired concentrations by blending solutions of conjugated polymers with solutions of organometallic emitters.

Example 3

Type I and Type II solutions prepared according to Example 2 were spin-cast at 2000 rpm in nitrogen atmosphere onto a PEDOT:PSS layer 15, itself laid down on an ITO electrode on a solid support, and thereafter, baked at 65° C. in nitrogen atmosphere for 1 hour.

A Ba electrode 12 (for electron injection) was formed thereon with a thickness of approx. 100 angstroms and then a protective Al overlayer was deposited with a thickness of approx. 2000 angstroms by vapor deposition at $10^{-6}$ Torr. [X. Gong, J. C. Ostrowski, M. R. Robinson, D. Moses, G. C. Bazan, and A. J. Heeger, Adv. Mat. 2002, 14, 581; X. Gong, J. C. Ostrowski, D. Moses, G. C. Bazan, A. J. Heeger, M. S. Liu, A. K-Y. Jen, Adv. Mat. 2003, 15, 45].

This example demonstrates that electrophosphorescent PLEDs can be fabricated by solution processing.

Example 4

Figure 1:
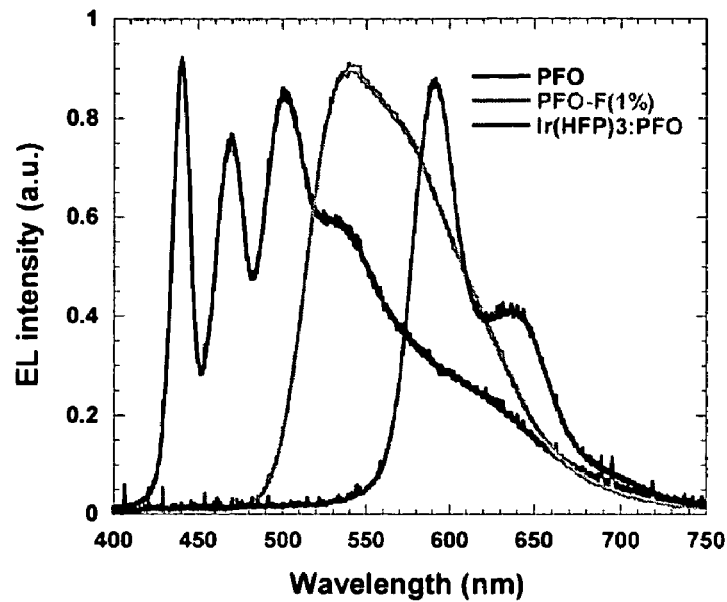
FIG. 1 shows the electroluminescent spectra of devices of the invention made of pure PFO, PFO-F (1%) and Ir(HFP)$_3$ doped into PFO (Ir(HFP)$_3$:PFO=1 wt.-%). These materials are described in FIG. 8.

FIG. 1 shows the electroluminescent spectra obtained from devices made from pure PFO, PFO-F (1%) and Ir(HFP)$_3$ doped into PFO (at a concentration of Ir(HFP)$_3$:/PFO=1 wt.-%). The strong green emission from "blue-emitting" PFO results from fluorenone defects generated during device fabrication/operation [X. Gong, P. Iyer, D. Moses, G. C. Bazan, A. J. Heeger, Adv. Func. Mater., 2003, 13, 325]. The broad green emission from PFO-F (1%) originates from excitation energy transfer in the copolymer from the PFO majority component to the fluorenone minority component. [X. Gong, D. Moses and A. J. Heeger, Synthe. Met. 2003]. The red emission with maximum at 600 nm and a shoulder at 620 is the Ir(HFP)$_3$ triplet emission. [X. Gong, J. C. Ostrowski, D. Moses, G. C. Bazan, A. J. Heeger, M. S. Liu, A. K-Y. Jen, Adv. Mat. 2003, 15, 45; J. C. Ostrowski, M. R. Robinson, A. J. Heeger and G. C. Bazan, Chem. Commun., 2002, 7, 784].

Example 5

Figure 2:
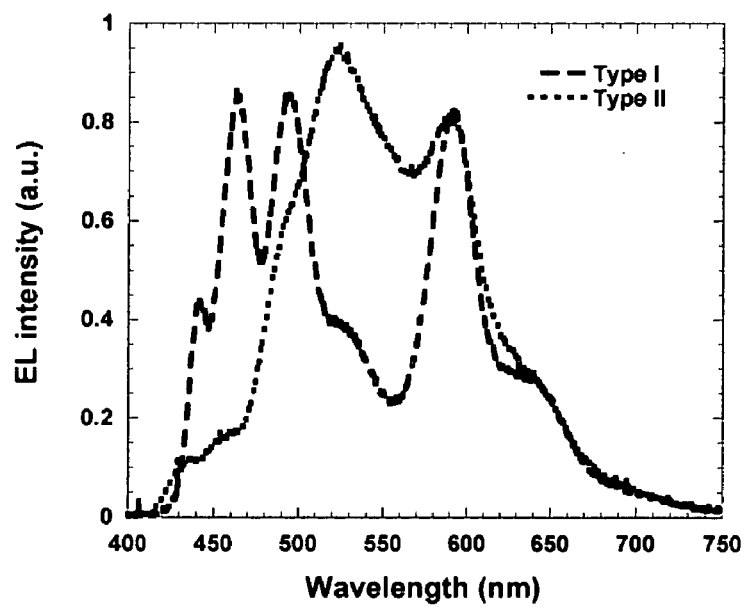
FIG. 2 shows the electroluminescent spectra obtained from Type I and Type II electrophosphorescent PLEDs of the invention.

FIG. 2 shows the electroluminescent spectra obtained from Type I and Type II devices. For Type I devices, white light was generated from two components, PFO and Ir(HFP)$_3$; both blue and green from PFO [X. Gong, P. Iyer, D. Moses, G. C. Bazan, A. J. Heeger, Adv. Func. Mater., 2003, 13, 325] and red from Ir(HFP)$_3$. For Type II devices, PFO-F (1%) was added into the PFO:Ir(HFP)$_3$ blends to fine-tune the color distribution. Therefore, white light was generated by Type II devices from three components, PFO, PFO-F (1%) and Ir(HFP)$_3$; blue and green from PFO, green from PFO-F (1%) [X. Gong, D. Moses and A. J. Heeger, Synthe. Met. 2003] and red from Ir(HFP)$_3$.

Example 6

Figure 3:
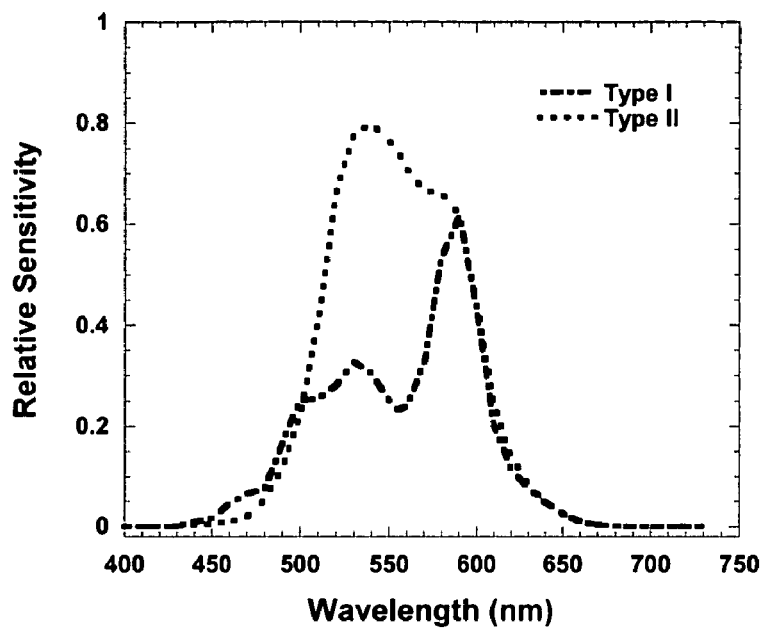
FIG. 3 shows the spectral sensitivity of the scotopic vision of the eye from the Type I and Type II electrophosphorescent PLEDs.

FIG. 3 shows the spectral sensitivity of the scotopic vision of the eye from the Type I and Type II electrophosphorescent PLEDs. FIG. 3 demonstrates that Type II electrophosphorescent PLEDs are well matched to the spectral sensitivity of the human eye.

Example 7

Figure 4:
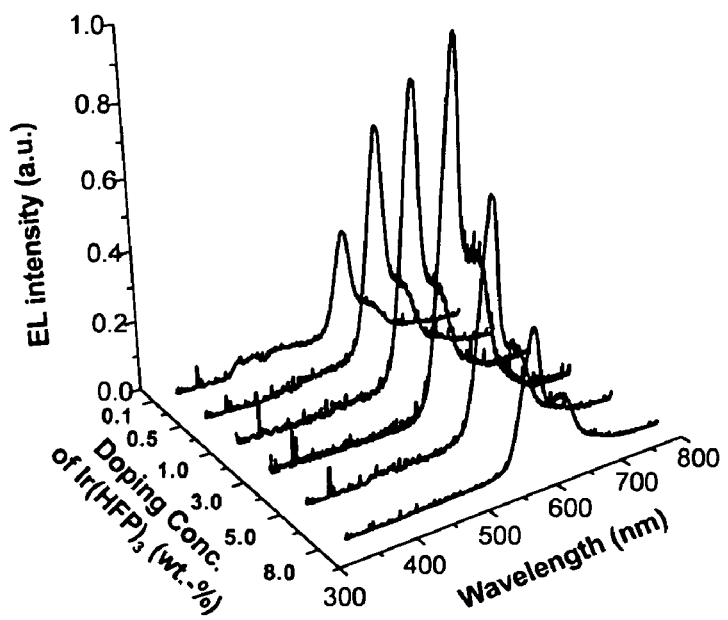
FIG. 4 shows the electroluminescent spectra of devices of this invention made from PFO doped with different concentrations of Ir(HFP)$_3$.

To better understand the wavelength tunability afforded by controlling the weight percent of PFO/Ir(HFP)$_3$, devices were fabricated from PFO doped with different concentrations of Ir(HFP)$_3$, ranging from less than $10^{-3}$ wt.-% to 8 wt.-%. For Ir(HFP)$_3$ concentrations smaller than $10^{-3}$ wt.-%, white emission was obtained with spectral composition shown in FIG. 2. For concentrations of Ir(HFP)$_3$>0.1 wt.-%, the emitted light was red. FIG. 4 shows the EL spectra obtained from devices made from PFO doped with different concentrations of Ir(HFP)$_3$. The absence of EL emission from PFO is consistent with charge trapping on the Ir(HFP)$_3$ (rather than energy transfer) as the dominant mechanism in electrophosphorescent PLEDs [X. Gong, J. C. Ostrowski, D. Moses, G. C. Bazan, A. J. Heeger, M. S. Liu, A. K-Y. Jen, Adv. Mat. 2003, 15, 45; X. Gong, J. C. Ostrowski, D. Moses, G. C. Bazan, A. J. Heeger, J. Poly. Sci. Poly. Phys. 2003; X. Gong, J. C. Ostrowski, M. R. Robinson, D. Moses, G. C. Bazan, and A. J. Heeger, Adv. Mat. 2002, 14, 581; X. Gong, J. C. Ostrowski, D. Moses, G. C. Bazan, and A. J. Heeger, Appl. Phys. Lett. 2002, 81, 3711].

Example 8

The CIE coordinates, CT and CRI were quantitatively evaluated from the electroluminescence (EL) spectra [G. Wyszelki and W. S. Stiles, Color Science, $2^{nd}$ ed. (wiley, N.Y.) 1982; D. B. Judd and G. Wyszeckl, Color in Business, Science and Industry, $3^{th}$ ed. (John Wiley & Sons) 1975].

Example 9

Figure 5:
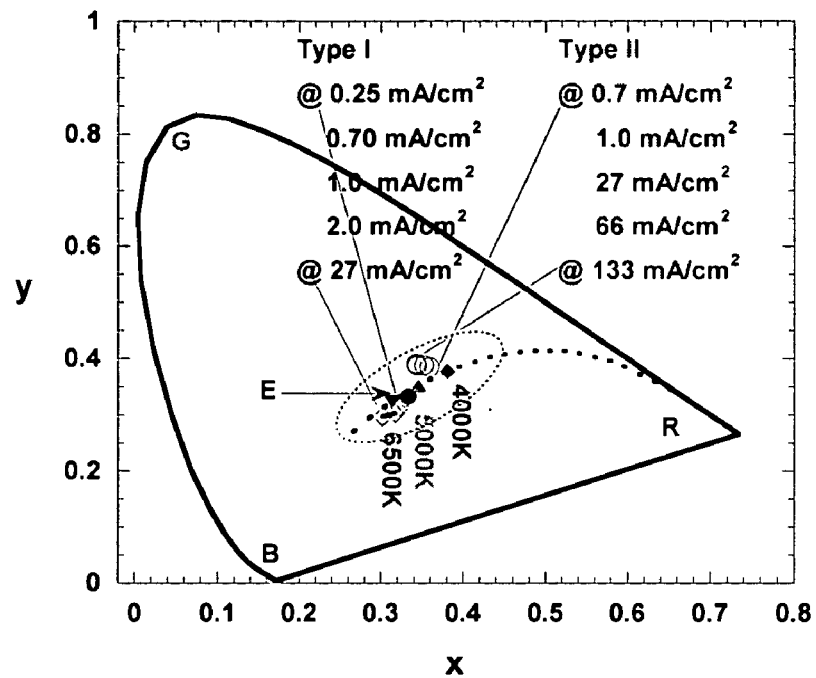
FIG. 5 shows the CIE (1931) chromaticity diagram, with coordinates corresponding to the emission from Type I devices (open squares) and Type II devices (open circles) biased at different current densities. Also shown are the equi-energy point, E, for pure white light (0.333, 0.333) (solid circles) and the coordinates corresponding to color temperatures of 4000° K (solid square), 5000° K (solid up triangle) and 6500° K (solid down triangle). The dotted line indicates different color temperatures; the dotted oval indicates the approximate area where the human eye perceives the color as white.

FIG. 5 shows the 1931 CIE chromaticity diagram, with coordinates corresponding to the emission from electrophosphorescent PLEDs: data points are shown for both Type I devices (open squares) and Type II devices (open circles) biased at different current densities. The Type I and Type II devices have CIE coordinates (0.329, 0.321) at current density (J) of 0.70 mA/cm$^2$ and (0.352, 0.388) at J=1 mA/cm$^2$, respectively, both of which are very close to the CIE coordinates for pure white light, (0.333, 0.333). The CIE coordinates show only minor shifts at different current densities. For Type I devices, CIE: Δx=±0.017, Δy=±0.021 from J=0.25 mA/cm$^2$ to J=27 mA/cm$^2$; for type II devices, CIE: Δx=±0.010, Δy=±0.008 from J=0.70 mA/cm$^2$ to J=133 mA/cm$^2$, demonstrating that the white light obtained from electrophosphorescent PLEDs have stable CIE coordinates.

The stability of the CIE coordinates as a function of the brightness is much better than reported previously for PLEDs/OLEDs [J. Kido, H. Shionoya, K. Nagai, Appl. Phys. Lett. 1995, 67, 2281; J. Kido, H. Hongawa, K. Okuyama and K. Nagai, Appl. Phys. Lett. 1994, 64, 815; Y. Z. Wang, R. G. Sun, F. Meghdadi, G. Leising, A. J. Epstein, Appl. Phys. Lett., 1999, 74, 3613].

Example 10

Type I devices have CT~6400K (see FIG. 5), very close to the CT of average daylight (6500K), [R. W. G. Hunt, Measuring Color, $2^{th}$ Ed. Ellis Horwood, 1991] and CRI=92. Type II devices have CT~4600K (see FIG. 5), very close to the CT of sunlight at solar altitude 20° (4700K) [R. W. G. Hunt, Measuring Color, $2^{th}$ Ed. Ellis Horwood, 1991], and CRI=86 (all values insensitive to J). The specific concentrations used in the Type I and Type II devices were chosen for example only; the CIE coordinates can be changed continuously by changing the composition of the blends. In FIG. 5, the dotted line indicates different color temperatures; the dotted oval indicates the approximate area where the human eye perceives the color as white.

Example 11

Figure 6:
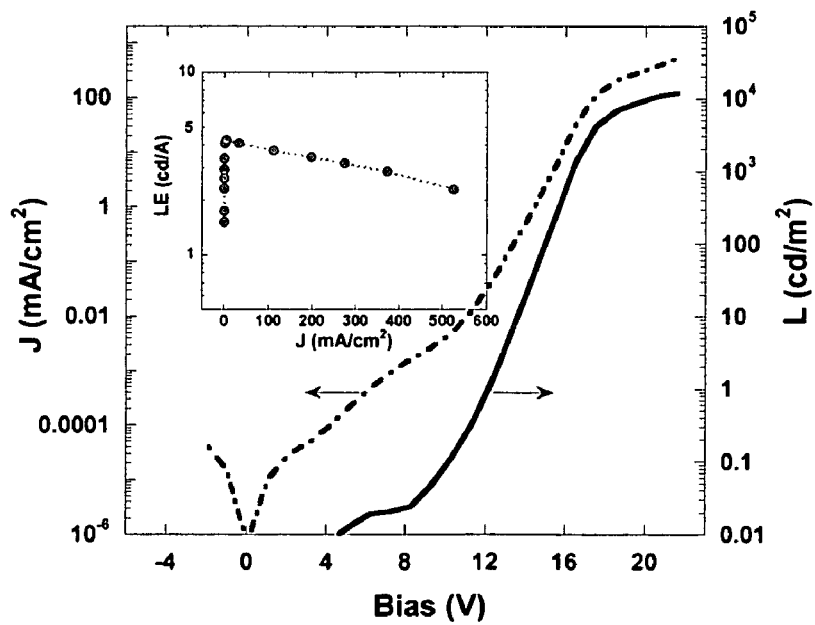
FIG. 6 shows the luminance (solid line) versus applied voltage and current density (dotted line) versus applied voltage for Type I devices. The inset shows the luminous efficiencies (solid circles) versus current density of Type I and Type II devices.

FIG. 6 shows the luminance (L) versus voltage (V) and current-density (J) versus voltage (V) characteristics for Type I devices. The Inset in FIG. 6 shows the luminance efficiency (LE) as a function of J. Both types of devices turned on at 5V. Type I devices gave $L_{max} \approx 1.2 \times 10^4$ cd/m² at 21 V. A lambertian intensity profile was assumed to calculate the luminous efficiency, LE (cd/A)=4.3 cd/A at J=5.2 mA/cm². Since the charge carriers are unbalanced in these devices, the LE can be enhanced by using an alternative hole injection layer.

Example 12

Figure 7:
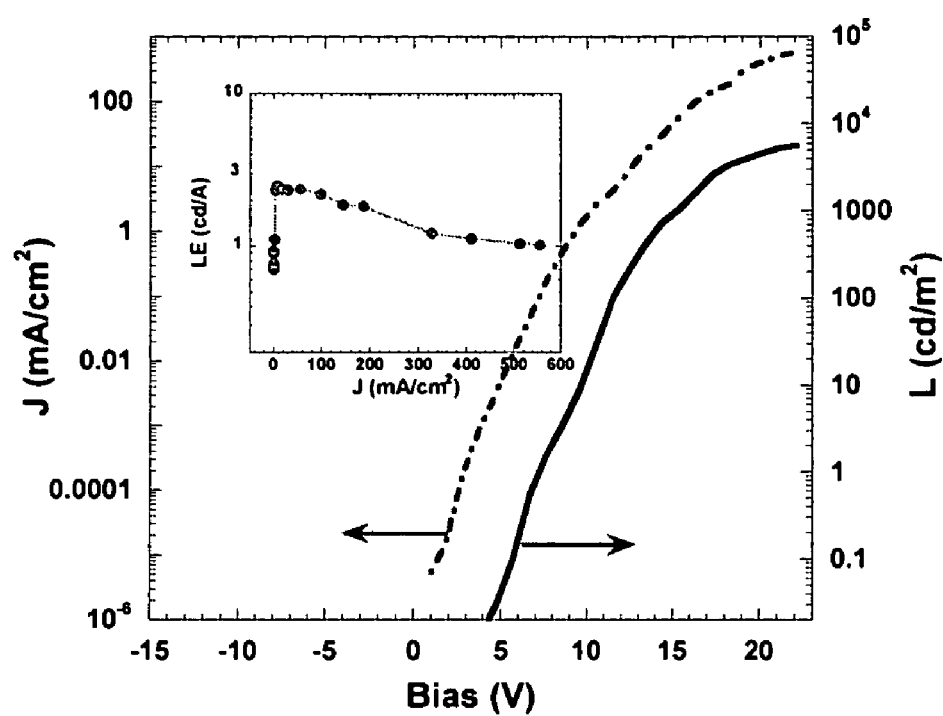
FIG. 7 shows the luminance (solid line) versus applied voltage and current density (dotted line) versus applied voltage for Type I devices. The inset shows the luminous efficiencies (solid circles) versus current density of Type I and Type II devices.

FIG. 7 shows the luminance (L) versus voltage (V) and current-density (J) versus voltage (V) characteristics for Type II devices. The Inset to FIG. 7 shows the luminance efficiency (LE) as a function of J. Both types of devices turn on at 5V. Type II devices gave $L_{max} \approx 6100$ cd/m² at 22 V. A lambertian intensity profile was assumed to calculate the luminous efficiency, LE (cd/A)=3 cd/A at J=8.5 mA/cm² for Type II devices. Since the charge carriers are unbalanced in these devices, the LE can be enhanced by using an alternative hole injection layer. [X. Gong, J. C. Ostrowski, D. Moses, G. C. Bazan, and A. J. Heeger, Appl. Phys. Lett. 2002, 81, 3711].

What is claimed:

1. An organic polymer based light-emitting device comprising an electron-injecting layer and a hole-injecting layer on opposite sides of an emissive layer, the emissive layer comprising at least one conjugated semiconducting polymer capable of fluorescent emission serving as host to at least one admixed phosphorescent emitter capable of phosphorescent emission, the fluorescent emission from the semiconducting polymer and the phosphorescent emission from the at least one admixed phosphorescent emitter occurring in a single emissive region, wherein the fluorescent emission is higher in photon energy than the phosphorescent emission and the emissive layer has a combined emission with CIE coordinates of, or close to the CIE coordinates of, pure white light.

2. The light-emitting device of claim 1 wherein the semiconducting polymer is a single polymer or copolymer capable of fluorescent emission.

3. The light-emitting device of claim 2 wherein the phosphorescent emitter is a single phosphorescent emitter.

4. The light-emitting device of claim 3 wherein the semiconducting polymer serves as a host to the phosphorescent emitter.

5. The light-emitting device of claim 1 wherein there are two or more phosphorescent emitters and wherein the semiconducting polymer serves as a common host to the two or more phosphorescent emitters.

6. The light-emitting device of claim 1 wherein the semiconducting polymer is a blend of two or more polymers or copolymers capable of fluorescent emission.

7. The light-emitting device of claim 6 wherein the phosphorescent emitter is a single emitter and wherein the blend of two or more polymers serves as a host to the phosphorescent emitter.

8. The light-emitting device of claim 6 wherein the phosphorescent emitter is at least two emitters and wherein the blend of two or more polymers serves as a common host.

9. The light-emitting device of claim 1 wherein the phosphorescent emitters are organometallic.

10. An organic polymeric light-emitting device comprising an organic polymeric emissive layer, wherein the emissive layer comprises:
    a) at least one conjugated organic polymeric fluorescent emitter, and
    b) at least one phosphorescent emitter in intimate admixture as a single emissive region; and
    wherein the emission from the at least one fluorescent emitters is higher in photon energy than the emission from the at least one phosphorescent emitters, and wherein the combined emission of the at least one fluorescent emitters and the at least one phosphorescent emitters sufficiently spans the visible spectrum to give a white emission, wherein the emissive layer is generated through solution processing.

11. The light-emitting device of claim 10 wherein the at least one organic polymeric fluorescent emitter serves as common host for the at least one phosphorescent emitter and wherein the color coordinates, color temperatures and the color rendering indices of the white emission are insensitive to brightness, applied voltage and applied current density.

12. The light-emitting device of claim 10 wherein the at least one organic polymeric emitters comprise a single conjugated polymer.

13. The light-emitting device of claim 10 wherein the at least one organic polymeric emitters comprise two conjugated copolymers.

14. The light-emitting device of claim 10, wherein the at least one fluorescent emitters are selected from polyfluorenes and poly(9,9-dioctylfluorene-co-fluorenone).

15. The light-emitting device of claim 10, wherein the at least one phosphorescent emitters are organometallic emitters.

16. The light-emitting device of claim 15, wherein the at least one organometallic emitters is tris (2,5-bis-2'-(9',9'-dihexylfluorene) pyridine) iridium (III), Ir(HFP)₃.

17. The light-emitting device of claim 10, wherein the combined emission covers the visible spectrum.

18. The light-emitting device of claim 10, wherein the combined emission has a CIE x-coordinate of 0.329±0.017 and a CIE y-coordinate of 0.321±0.021.

19. The light-emitting device of claim 10, wherein the combined emission has a color temperature of about 6400K or a color temperature of about 4600K.

20. The light-emitting device of claim 10, wherein the combined emission has a color rendering index of at least 86.

21. The light-emitting device of claim 10, wherein the CIE coordinate, color temperature and color rendering index are insensitive to the brightness.

22. The light-emitting device of claim 10, wherein the CIE coordinate, color temperature and color rendering index are insensitive to applied voltages.

23. The light-emitting device of claim 10, wherein the CIE coordinate, color temperature and color rendering index are insensitive to current density.

24. A polymeric light-emitting device comprising in layer contact order:
   a) an anode;
   b) a hole-injection layer;
   c) an emissive layer; and
   d) a cathode; wherein the emissive layer comprises, as a single emissive region, an admixture of at least one fluorescent conjugated semiconducting polymer providing a fluorescent emission with at least one phosphorescent emitter providing a phosphorescent emission, said fluorescent emission being higher in photon energy than said phosphorescent emission, wherein the emissive layer has a combined emission with CIE coordinates of, or close to the CIE coordinates of, pure white light.

25. The light-emitting device of claim 24 wherein the hole-injection layer comprises at least one material selected from poly(3,4-ethylene dioxythiophene): poly(styrene sulfonic acid) (PEDOT:PSS) and poly(bis(tetraphenyldiamino)biphenyl-perfluorocyclobutane) (poly(BTPD-Si-PFCB)).

26. An organic light-emitting device comprising an emissive layer between an anode and a cathode, wherein the emissive layer is comprised of a conjugated polymer fluorescent compound and a phosphorescent compound that has a peak maximum of emission longer than that of the fluorescent compound and wherein the light emission involves both emission of the fluorescent compound and emission of the phosphorescent compound from a single emissive region, wherein the emissive layer has a combined emission with CIE coordinates of, or close to the CIE coordinates of, pure white light.

27. The organic light-emitting device of claim 26 wherein the fluorescent compound is a host of the emissive layer and the phosphorescent compound is a dopant.

28. The organic light-emitting device of claim 26 wherein the fluorescent compound is polyfluorene.

29. The organic light-emitting device of claim 26 wherein the fluorescent compound is a low-molecular-weight oligomer.

30. The organic light-emitting device of claim 29 wherein the low-molecular-weight oligomer has more than two carbazolyl groups.

31. The organic light-emitting device of claims 26 or 27 wherein the phosphorescent compound is an organometallic complex that has Ir, Pt, Os, Ru or Au as a center atom.

32. The organic light-emitting device of claims 26 or 27 which produces the emission of white hue, further comprising a set of color filters at the side of outcoupling of the emission.

* * * * *